(12) United States Patent
Yeo et al.

(10) Patent No.: US 6,844,238 B2
(45) Date of Patent: Jan. 18, 2005

(54) MULTIPLE-GATE TRANSISTORS WITH IMPROVED GATE CONTROL

(75) Inventors: Yee-Chia Yeo, Hsinchu (TW); Fu-Liang Yang, Hsin-Chu (TW); Chenming Hu, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/401,087

(22) Filed: Mar. 26, 2003

(65) Prior Publication Data

US 2004/0198003 A1 Oct. 7, 2004

(51) Int. Cl.[7] ...................... H01L 21/76; H01L 21/8238

(52) U.S. Cl. ........................ 438/424; 438/216; 438/421

(58) Field of Search ................................. 438/216, 240, 438/287, 421, 424

(56) References Cited

U.S. PATENT DOCUMENTS

| 6,514,808 | B1 | * | 2/2003 | Samavedam et al. | ....... 438/197 |
|---|---|---|---|---|---|
| 6,521,949 | B2 | * | 2/2003 | Assaderaghi et al. | ....... 257/347 |
| 6,596,599 | B1 | * | 7/2003 | Guo | ........................... 438/305 |
| 2003/0011080 | A1 | * | 1/2003 | Deshpande et al. | ......... 257/900 |
| 2003/0111678 | A1 | * | 6/2003 | Colobuo et al. | ............ 257/240 |

* cited by examiner

Primary Examiner—Amir Zarabian
Assistant Examiner—Pamela E Perkins
(74) Attorney, Agent, or Firm—Tung & Associates

(57) ABSTRACT

A method for fabricating a multiple-gate device including the steps of providing a substrate of a semi-conducting layer on an insulator stack which includes an insulator layer overlying an etch-stop layer; patterning a semi-conducting layer forming a semiconductor fin; etching the insulator layer at the base of the fin forming an undercut; depositing a gate dielectric layer overlying the fin; depositing an electrically conductive layer over the gate dielectric layer; etching the electrically conductive layer forming a gate straddling across the two sidewall surfaces and the top surface of the fin; and forming a source region and a drain region in the fin.

31 Claims, 4 Drawing Sheets

US 6,844,238 B2

MULTIPLE-GATE TRANSISTORS WITH IMPROVED GATE CONTROL

FIELD OF THE INVENTION

The present invention generally relates to the field of semiconductor devices, and more particularly, to the manufacture of metal oxide semiconductor field effect transistors with multiple-gates.

BACKGROUND OF THE INVENTION

Metal-oxide-semiconductor field effect transistor (MOSFET) technology is the dominant semiconductor technology used for the manufacture of ultra-large scale integrated (ULSI) circuits. Reduction in the size of MOSFETs have provided continued improvement in speed performance, circuit density, and cost per unit function over the past few decades. As the gate length of the conventional bulk MOSFET is reduced, the source and drain increase interact with the channel and gain influence on the channel potential. Consequently, a transistor with a short gate length suffers from problems related to the inability of the gate to substantially control the on and off states of the channel. Phenomena such as reduced gate control associated with transistors with short channel lengths are termed short-channel effects. Increased body doping concentration, reduced gate oxide thickness, and ultra-shallow source/drain junctions are ways to suppress short-channel effects. However, for device scaling well into the sub-50 nm regime, the requirements for body-doping concentration, gate oxide thickness, and source/drain (S/D) doping profiles become increasingly difficult to meet when conventional device structures based on bulk silicon substrates are employed. Innovations in front-end process technologies or the introduction of alternative device structures are required to sustain the historical pace of scaling.

For device scaling well into the sub-30 nm regime, a promising approach for controlling short-channel effects is to use an alternative device structure with multiple-gate electrodes. Examples of multiple-gate structures include the double-gate structure, the triple-gate structure, the omega-FET structure, and the surround-gate or wrap-around gate structure. A multiple-gate transistor structure is expected to extend the scalability of CMOS technology beyond the limitations of the conventional bulk MOSFET and realize the ultimate limit of silicon MOSFETS. The introduction of additional gates improves the capacitance coupling between the gates and the channel, increases the control of the channel potential by the gate, helps to suppress short channel effects, and prolongs the scalability of the MOS transistor.

An example of a multiple-gate device is the double-gate MOSFET structure, wherein there are two gate electrodes on the opposing sides of the channel or silicon body. A method to fabricate a double-gate MOSFET is described in U.S. Pat. No. 6,413,802 B1 and shown in FIG. 1A for FinFET transistor structures 10 having a double gate channel extending vertically from a substrate and methods of manufacture. In U.S. Pat. No. 6,413,802 B1, the device channel includes a thin silicon fin 12 formed on an insulative substrate 14 (e.g., silicon oxide) and defined using an etchant mask 16. Gate oxidation is performed, followed by gate deposition and gate patterning to form a double-gate electrode 20 overlying the sides 22, 24 of the fin 12. Both the source-to-drain direction and the gate-to-gate direction are in the plane of the substrate surface. The device structure 10, an enlarged, cross-sectional view of which is illustrated in FIG. 1A, is widely recognized to be one of the most manufacturable double-gate structures. A plane view of the double-gate structure 10 is shown in FIG. 1C.

Another example of the multiple-gate transistor is the triple-gate transistor. An enlarged, cross-sectional view of the triple-gate transistor structure 30 is illustrated in FIG. 2A. A plane view of the triple-gate structure 30 is shown in FIG. 2C. The triple-gate transistor structure 30 has three gates: gate 32 on the top surface 42 of the silicon fin 12, and gates 34,36 on the sidewalls 44,46 of the silicon fin 12. The triple-gate structure 30 achieves better gate control than the double-gate device 10 because of the extra gate 32 on the top 42 of the silicon fin 12. The double-gate device structure 10 and the triple-gate device structure 30 may be improved by further enhancing the gate control.

An illustration of the cross-section of the double-gate device is shown in FIG. 1A. FIG. 2A illustrates the cross-section of the triple-gate device. Both the double-gate structure 10 and triple-gate structure 30 have a silicon body or fin 12 that overlies an insulator substrate 14. The double-gate device structure 10 (FIG. 1A) has a gate electrode 20 that wraps around the silicon fin 12 covered with a gate dielectric layer 26 on its two sidewalls 22,24. The gate electrode 20' therefore forms two gates 34,36, one on each sidewall 22,24 of the silicon fin 12. For the triple-gate device structure 30 (FIG. 2A), the gate electrode 20 that wraps around the gate dielectric layer 26 covered silicon fin 12 forms three gates: 34,36 gate 32 on the top surface 42 of the silicon fin 12, and two gates 34,36 on the sidewalls 22,24 of the silicon fin 12.

The double-gate device structure 10 and the triple-gate device structure 30 may be improved by further enhancing the gate control. For example, the gate electrode 20 in the double-gate structure 40 may encroach under the silicon fin 12 forming an undercut 28 as shown in FIG. 1B. For the triple-gate structure 50, the gate electrode 20 may also encroach under the silicon fin 12 as shown in FIG. 2B. For the triple-gate structure 50, the encroachment of the gate electrode 20 under the silicon fin 12 forms an omega-shaped gate structure. This improved triple-gate transistor structure 50, also called the Omega field-effect transistor (FET), has the closest resemblance to the Gate-All-Around (GAA) transistor for excellent scalability, and uses a very manufacturable process similar to that for the double-gate or triple-gate transistor. The Omega-FET has a top gate like the conventional ultra-thin body silicon-on-insulator transistor, sidewall gates like double-gate transistors, and special gate extensions or encroachments under the silicon body. The Omega-FET is therefore a field effect transistor with a gate that almost wraps around the body. In fact, the longer the gate extension, i.e., the greater the extent of the encroachment, the more the structure approaches or resembles the gate-all-around structure. A three-dimensional perspective of an Omega-FET 50 is shown in FIG. 3.

The encroachment of the gate electrode under the silicon body helps to shield the channel from electric field lines from the drain and improves gate-to-channel controllability, thus alleviating the drain-induced barrier lowering effect and improving short-channel performance. The encroachment of the gate electrode under the silicon body relies on an undercut of the insulator layer in the substrate, thus forming a notch in the substrate at the base of the silicon body.

A simple process flow for fabricating the multiple-gate structure 50 with an omega-shaped electrode 20 is shown in FIGS. 4A–4C. It provides a vertical semiconductor fin 12 overlying a substrate 18 including a surface insulator layer 14. A cross-section of the fin 12 is shown in FIG. 4A. An undercut 28 in the insulator layer 14 of the substrate 18 is formed by an etch process, as shown in FIG. 4B. For example, if the insulator 14 is silicon oxide, the etch may be performed by a wet etch using diluted hydrofluoric acid (HF) (for example, a mixture of 25 parts of water and 1 part of concentrated HF) for 60 seconds at 25 degrees Celsius to achieve a recess "R" of about 100 angstroms. The etch process also etches laterally, resulting in an undercut 28 below the silicon fin 12. However, such a timed etch is not a very controllable process and introduces significant variability of the value of recess R within wafer and from process run to run. After formation of the substrate recess, the gate dielectric layer 26, gate electrode 20 (FIG. 4C), and source/drain regions 52,54 are formed to complete the device fabrication. It is important to limit the variability of the recess R in a manufacturing process as this affects the tolerance in the subsequent gate etch process.

It is therefore an object of the present invention to provide a method for forming a double-gate transistor with improved gate control.

It is another object of the present invention to provide a method for forming a triple-gate transistor with improved gate control.

SUMMARY OF THE INVENTION

In accordance with the present invention, a method for fabricating a multiple-gate device and the multiple-gate device structure fabricated are disclosed.

In a preferred embodiment, a method for fabricating a multiple-gate device can be carried out by the operating steps of providing a substrate that includes a semi-conducting layer overlying an insulator stack, the insulator stack includes an insulator layer overlying an etch-stop layer; patterning the semi-conducting layer forming a semiconductor fin, the semiconductor fin has two sidewalls and a top; etching the insulating layer at the base of the semiconductor fin forming an undercut; depositing a gate dielectric layer overlying the semiconductor fin; depositing an electrically conductive layer over the gate dielectric layer; etching the electrically conductive layer forming a gate straddling across the two sidewall surfaces and the top surface of the semiconductor fin; and forming a source region and a drain region in the semiconductor fin.

In the method for fabricating a multiple-gate device, the semi-conducting layer may include silicon, or silicon and germanium. The insulator layer may be a dielectric, or silicon oxide. The insulator layer may have a thickness between 20 angstroms and 1000 angstroms. The etch-top layer may be formed of silicon nitride, or may be formed of a dielectric layer that has a lower etch rate than the insulator layer. The etch-stop layer may have a thickness between 20 angstroms and 1000 angstroms. The fin formation process may further include a fin surface smoothing step, wherein the surface smoothing step may include sub-steps of sacrificial layer oxidation and high temperature annealing in a hydrogen ambient.

In the method, the etching step for the insulator layer may be a wet etch process which etches the insulator layer and stops on the etch-stop layer. The method may further include the step of conducting the wet etch process by using a diluted hydrofluoric acid. The etching step for forming the undercut may further include a dry etch process followed by a wet etch process. The dry etch process etches the insulator layer stopping on the etch-stop layer. The wet etch process utilizes a diluted hydrofluoric acid. The method may further include the step of forming the undercut in a recess between 50 angstroms and 1000 angstroms, or the step of forming the undercut in a gate encroachment between 20 angstroms and 500 angstroms. The gate dielectric layer may be formed of silicon oxide, or silicon oxynitride, or a high permittivity material selected from $La_2O_3$, $Al_2O_3$, $HfO_2$, HFON and $ZrO_2$. A relative permittivity of the high permittivity material is greater than 5. The gate dielectric layer has a thickness between 3 angstroms and 100 angstroms. The gate dielectric layer may have a first thickness on the fin sidewall and a second thickness on the fin top, the first thickness is different than the second thickness. The second thickness may be smaller than the first thickness. The second thickness may be smaller than 20 angstroms. The gate material may be poly-crystalline silicon or poly-crystalline silicon germanium. The source and drain regions each has a lightly doped or extension region. The electrically conductive material deposited over the gate dielectric layer is formed on the source and drain regions. The electrically conductive material may be a metal, a metallic silicide or a metallic nitride.

The present invention is further directed to a multiple-gate device structure which includes a substrate that has an insulator layer overlying an etch-stop layer; a semiconductor fin formed vertically on the substrate, the semiconductor fin has two sidewalls and a top; the gate dielectric layer overlying the semiconductor fin; and source and drain regions formed in the semiconductor fin separated by the gate electrode.

In the multiple-gate device structure, the semiconductor fin may be formed of silicon, or may be formed of silicon and germanium. The semiconductor fin may be formed with rounded corners at the top. The insulator layer may be a dielectric material, or may be silicon oxide. The insulator layer may be formed to a thickness between 20 angstroms and 1000 angstroms. The etch-stop layer may be formed of silicon nitride, or may be formed of a dielectric having a lower etch rate than the insulator layer, or may be formed to a thickness between 20 angstroms and 1000 angstroms. The gate dielectric layer may be formed of silicon oxide, or may be formed of silicon oxynitride, or may be formed of a high permittivity material selected from $La_2O_3$, $Al_2O_3$, $HfO_2$, HfON and $ZrO_2$. The relative permittivity of the high permittivity material is greater than 5. The gate dielectric material may be formed to a thickness between 3 angstroms and 100 angstroms. The gate dielectric material may have a first thickness on the fin sidewall and a second thickness on the fin top wherein the first thickness is different than the second thickness. The second thickness may be smaller than the first thickness. The gate electrode may be formed of polycrystalline silicon, or poly-crystalline silicon germanium, or may be formed of a metal. The source and drain regions each to include a lightly doped or extension region, or strapped by an electrically conductive material of metal or silicide. The electrical communication between the gate electrode and the source and drain regions is made on the sidewalls and the top of the semiconductor fin.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1A:
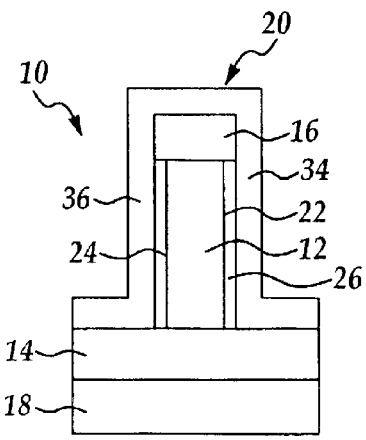
FIGS. 1A–1C are enlarged, cross-sectional views and a plane view of a conventional double-gate device structure without and with an undercut, respectively.
Figure 1B:
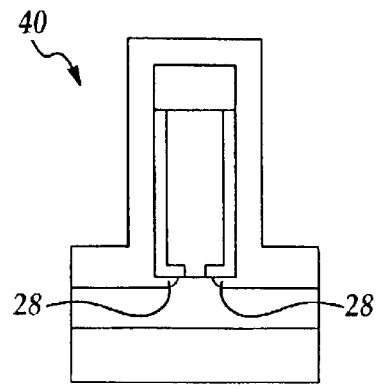
Figure 1C:
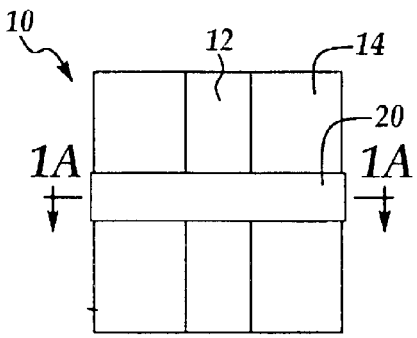
Figure 2A:
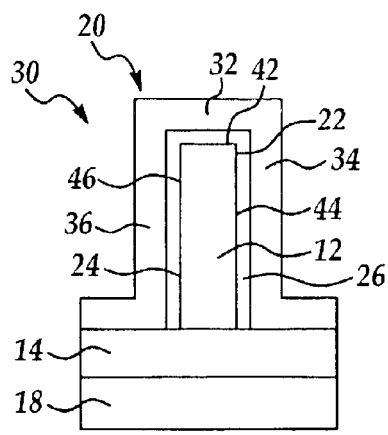
FIGS. 2A–2C are enlarged, cross-sectional views and a plane view of a conventional triple-gate device structure without an with an undercut, respectively.
Figure 2B:
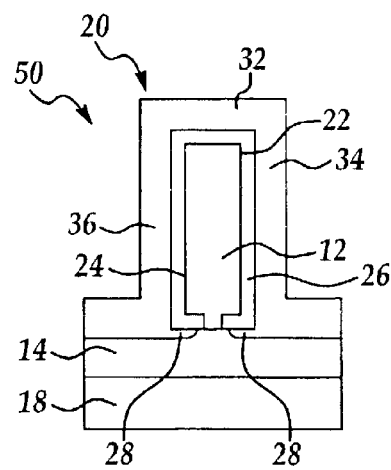
Figure 2C:
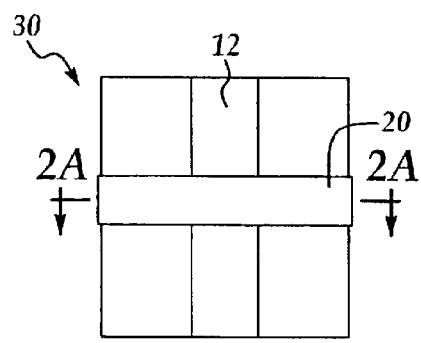
Figure 3:
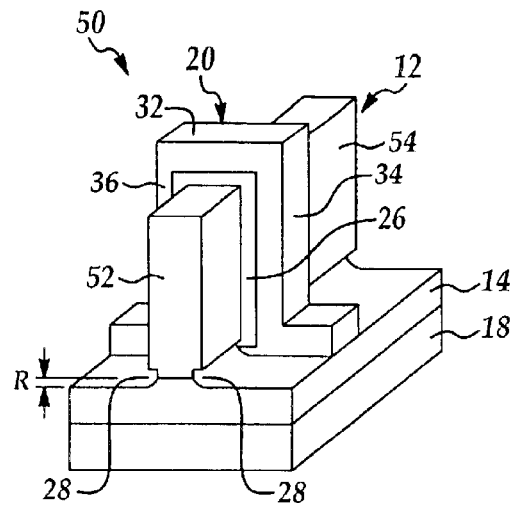
FIG. 3 is an enlarged, perspective view of a conventional omega-FET.
Figure 4A:
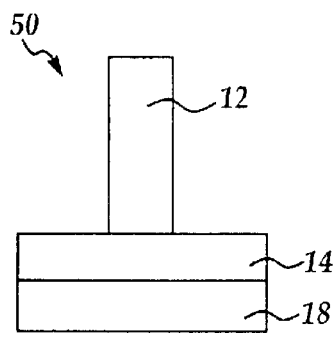
FIGS. 4A–4C are enlarged, cross-sectional views illustrating a process flow for the formation of a conventional field-effect transistor with an omega-shaped electrode.
Figure 4B:
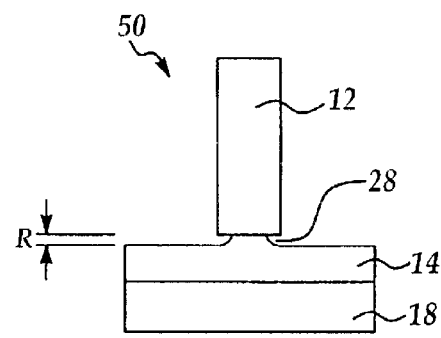
Figure 4C:
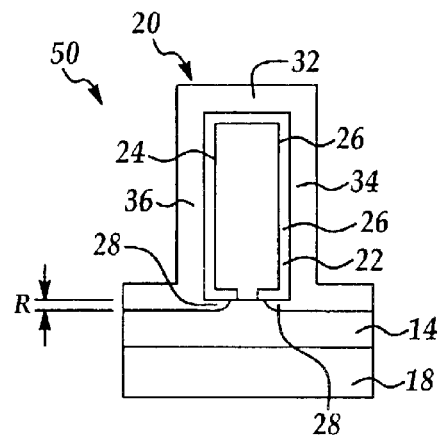
Figure 5A:
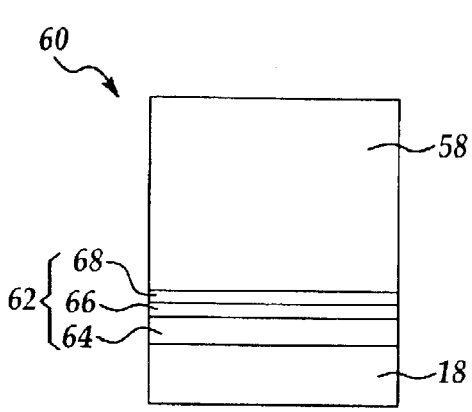
FIGS. 5A–5E are enlarged, cross-sectional views illustrating a process flow for a present invention triple-gate structure incorporating the use of an etch stop layer.

The present invention provides an improved process wherein an etch stop layer is used to control the amount of recess R. It achieves accurate control of the recess and an improved process window with little variability. The improved process, i.e., the preferred embodiment of the present invention, is schematically described in FIG. 5A–5E. FIGS. 5A–5E show the device cross-sections at the various process steps, as observed along line A–A' in the plane view for the completed device in FIG. 6. The starting substrate is a silicon-on-insulator substrate, as shown in FIG. 5A. The starting substrate comprises of a silicon film 58 overlying an insulator stack 62. The insulator stack 62 comprises of a first insulator layer 68 overlying an etch-stop 66 layer which overlies a second insulator layer 64. The first insulator layer 64 can be made of any first dielectric material such as silicon oxide. The first insulator layer 68 has a thickness of between 20 angstroms and 1000 angstroms. The second insulator layer 64 may be made of the same material as the first insulator layer 68. The second insulator layer 64 has a thickness of between 20 angstroms and 1000 angstroms. In the preferred embodiment, the first dielectric material is silicon oxide. The etch stop layer 66 can be any second dielectric material which has a reduced etch rat compared to the first dielectric material. If the first dielectric material is silicon oxide, which can be etched using diluted hydrofluoric acid, the second dielectric material can be silicon nitride. The etch-stop layer 66 may have a thickness of between 20 and 1000 angstroms.

Figure 5B:
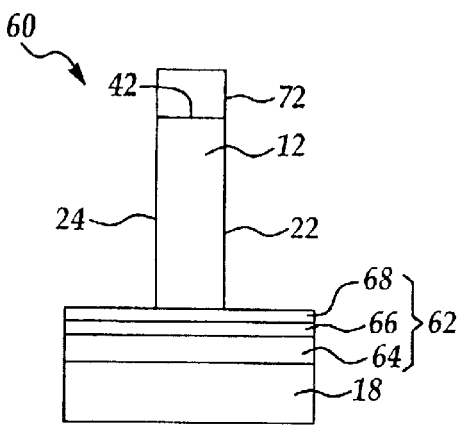
Figure 5C:
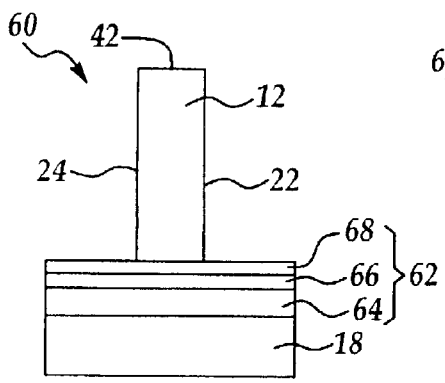
Figure 6:
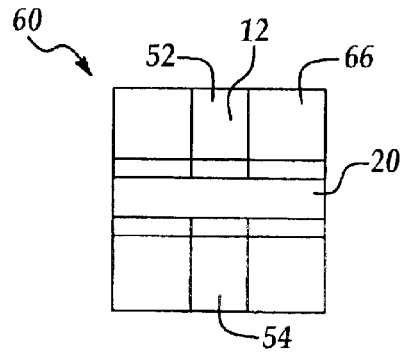
FIG. 6 is an enlarged, plane view of the present invention device structure prepared by the process of FIGS. 5A–5E.

The silicon fin 12 is patterned using an etchant mask 72, as shown in FIG. 5B. The etchant mask 72 may be a material commonly used for masking an etch process, such as photoresist, silicon oxide, silicon nitride, etc. In the preferred embodiment, the etchant mask is silicon oxide. In the present invention, an optical fin surface smoothing step is used to improve or reduce the surface roughness of the fin sidewalls 22,24. If the etchant mask 72 used for fin definition is silicon oxide, as in the preferred embodiment, it may be removed before or after the fin smoothing process. The removal of the etchant mask 72 on the silicon fin 12 prior to gate dielectric layer 26 formed on each of the two sidewalls 22,24 as well as the top surface 42 of the fin 12, as shown in FIG. 5C. If the etchant mask 72 used for fin definition is a photoresist, it has to be removed before the fin surface smoothing step to avoid the high temperatures used in the fin smoothing process. The fin surface smoothing is performed by subjecting the fin to a sacrificial oxidation and/or silicon sidewall treatment (e.g. high temperature anneal at 1000 degrees C. in $H_2$ ambient). The surface smoothing of the fin sidewalls 22,24 contributes to the achievement of good carrier mobilities. Depending on whether the silicon oxide etchant mask 72 is removed prior to the fin smoothing process step, the shape of the fin 12 may be square-like or rounded at the top. If the etchant mask 72 may be retained on the fin 12 throughout the process, the final device structure will be a double-gate device structure.

Figure 5D:
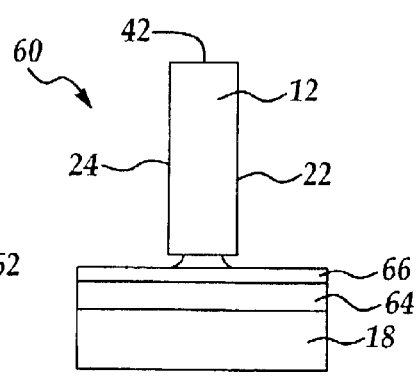
Figure 5E:
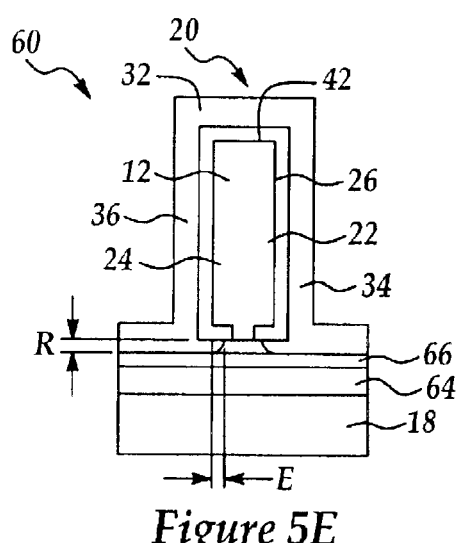
Figure 7:
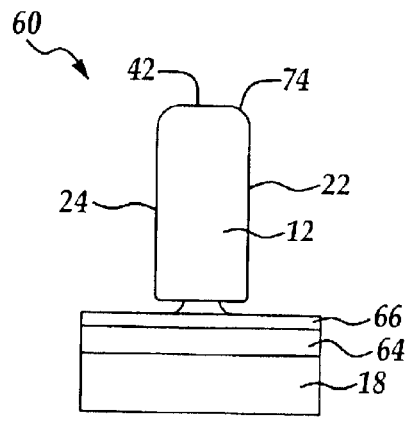
FIG. 7 is an enlarged, cross-sectional view of a silicon fin formed with rounded edges.

The next step is the formation of a recessed substrate which generally involves an etch process (FIG. 5D). An example of an etch process is a wet etch using dilute hydrofluoric acid (HF) (a mixture of 25 parts of water and 1 part of concentrated HF) for 30–600 seconds at 25 degrees Celsius to etch about 50–1000 angstroms of thermally grown silicon oxide. The actual recess R, as indicated in FIG. 5E, is determined by the thickness of the first insulator layer 68. In the preferred embodiment, the recess R is between 50 angstroms and 1000 angstroms. The etch time affects the amount of encroachment E, as indicated in FIG. 5E. An alternative etch process may employ a two step etch comprising of a dry etch followed by a wet etch. The dry etch removes the first insulator layer 68 with high anisotropy, i.e., little lateral etch, and can be achieved using a plasma etch employing fluorine chemistry known and used in the art. The wet etch etches laterally beneath the silicon body and its etch time controls the encroachment of the gate under the silicon body in the final device structure. In the preferred embodiment, the encroachment E is between 20 and 500 angstroms. The preceding description completes the fin and substrate recess formation, and the cross-section of the device is shown in FIG. 5D. When the fin 12 has rounded edges 74, the cross-section of the device 60 is shown in FIG. 7.

The process is then followed by gate dielectric layer 26 formation. The gate dielectric layer 26 may be formed by thermal oxidation, chemical vapor deposition, sputtering, etc. In general, the thickness of the gate dielectric may be different on the sidewalls 22,24 of the fin 12 and the top 42 of the fin 12. Depending on the technique of gate dielectric layer 26 formation, the gate dielectric thickness on the top 42 of the fin may be thinner than the thickness on the fin sidewalls 22,24. In one embodiment, the gate dielectric thickness on the top surface 42 of the fin 12 is less than 20 angstroms. The gate dielectric may include a conventional material such as silicon dioxide or silicon oxynitride with a thickness ranging from 3 angstroms to 100 angstroms, preferably 10 angstroms or less. The gate dielectric may also include a high permittivity (high-k) material such as lanthanum oxide $La_2O_3$, aluminum oxide $Al_2O_3$, hafnium oxide $HfO_2$, hafnium oxynitride HfON, or zirconium oxide ZrO2, with an equivalent oxide thickness of 3 angstroms to 100 angstroms.

Next, a gate material is deposited. The gate material may be polycrystalline-silicon (poly-Si), poly-crystalline silicon germanium (poly-SiGe), a refractory metal such as molybdenum and tungsten, compounds such as titanium nitride, or other electrically conducting materials. A gate mask is defined and the underlying gate material is etched to form the gate electrode 20. The gate etch stops on the gate dielectric, and the gate is electrically isolated from the transistor structure by the gate dielectric layer 26. In the preferred embodiment, the gate material is poly-Si and the gate dielectric is silicon oxynitride. A plasma etch using chlorine and bromine chemistry may be used to achieve a high etch selectivity in excess of 2000. A high etch selectivity is critical for device structures with a tall fin and aggressively scaled gate dielectric thickness.

Figure 8:
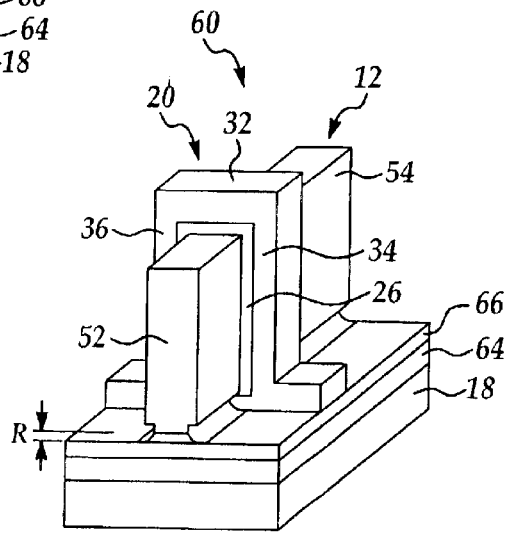
FIG. 8 is an enlarged, perspective view of an omega-FET formed using the present invention method.
Figure 9A:
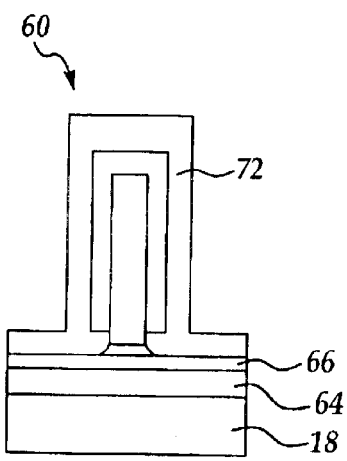
FIGS. 9A–9B are enlarged, cross-sectional views taken along lines B–B' and C–C', respectively, in the plane view of FIG. 6.
Figure 9B:
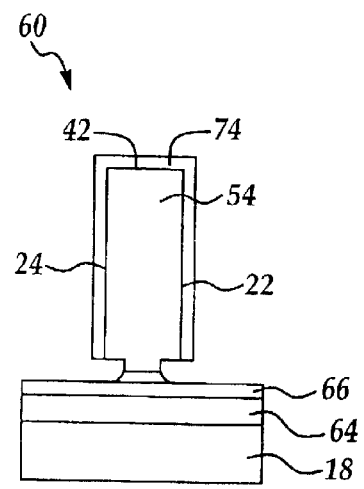

After the definition of the gate electrode 20, the gate mask can be removed. At this stage of the device fabrication, a three-dimensional perspective view of the device 60 is illustrated in FIG. 8 (spacers and source/drain extensions not shown). The lightly-doped drain (LDD) or drain extension is formed next. This may be achieved by ion implantation, plasma immersion ion implantation (PIII), or other techniques known and used in the art, e.g., deposition and selective etching of the spacer material. The spacer material may be a dielectric material such as silicon nitride or silicon dioxide. In the preferred embodiment, the spacer 72 includes of silicon nitride and oxide composite spacer. After spacer formation, source and drain regions are doped by ion implantation, PIII, gas or solid source diffusion, or any other techniques known and used in the art. An implant damage or amorphization can be annealed through subsequent exposure to elevated temperatures. The resistance of the source, drain, and gate can also be reduced by strapping the source, drain, and gate with a conductive material layer 74. The conductive material layer 74 may be a metallic silicide such as titanium silicide, cobalt silicide, or nickel silicide, a metallic nitride such as titanium nitride and tantalum nitride, a metal such as tungsten and copper, or a heavily doped semiconductor such as n+ doped Si. In the preferred embodiment, the conductive material layer 74 is nickel silicide which may be formed by a self-aligned silicide (salicide) process. In the source and drain regions, the conductive material layer 74 may be formed on both the top 42 of the fin as well as the sidewalls 22,24 of the fin. The cross-sections along lines B–B' and C–C' of the completed device (FIG. 6) are shown in FIG. 9. Next, contacts are formed to the source, drain, and gate regions using techniques known and used in the art. It is important to achieve a very low contact resistance in nanoscale devices.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows:

What is claimed is:

1. A method for fabricating a multiple-gate device comprising the step of:
    providing a substrate comprising a semi-conducting layer overlaying an insulator stack, said insulator stack comprises an insulator layer overlying an etch-stop layer;
    patterning said semi-conducting layer forming a semiconductor fin, said semi-conductor fin having two sidewalls and a top, said fin formation process comprises a fin surface smoothing step which further comprises sub-steps of sacrificial layer oxidation arid high temperature anneal in a hydrogen ambient;
    etching said insulator layer at the base of said semiconductor fin forming an undercut;
    depositing a gate dielectric layer overlying said semiconductor fin;
    depositing an electrically conductive layer over said gate dielectric layer;
    etching said electrically conductive layer forming a gate straddling across said two sidewall surface and said top surface of the semiconductor fin; and
    forming a source region and a drain region in said semi conductor fin.

2. The method of claim 1 wherein said semi-conducting layer comprises, silicon.

3. The method of claim 1, wherein said semi-conducting layer comprises silicon and germanium.

4. The method of claim 1, wherein said insulator layer comprises a dielectric.

5. The method of claim 1, wherein said insulator layer comprises silicon oxide.

6. The method of claim 1, wherein said insulator layer has a thickness between 20 angstroms and 1000 angstroms.

7. The method of claim 1, wherein said etch-stop layer comprises silicon nitride.

8. The method of claim 1, wherein said etch-stop layer comprises a dielectric having a lower etch rate than said insulator layer.

9. The method of claim 1, wherein said etch stop layer has a thickness, between 20 angstroms and 1000 angstroms.

10. The method of claim 1, wherein said etching step for said insulator layer comprises a wet etch process.

11. The method of claim 10, wherein said wet etch process etches said insulator layer and stops on said etch-stop layer.

12. The method of claim 10 further comprising the step of conducting said wet etch process by using a diluted hydrofluoric acid.

13. The method of claim 1, wherein said etching stop for forming said undercut comprises a dry etch process followed by a wet etch process.

14. The method of claim 13, wherein said dry etch process etches, said insulator layer stopping on said etch-stop layer.

15. The method of claim 10, wherein said wet etch process uses a diluted hydrofluoric acid.

16. The method of claim 1 further comprising the step of forming said undercut in a recess between 50 angstroms and 1000 angstroms.

17. The method of claim 1, further comprising the step of forming said undercut in a gate encroachment between 20 angstroms and 500 angstroms.

18. The method of claim 1, wherein said gate dielectric layer comprises silicon oxide.

19. The method of claim 1, wherein said gate dielectric layer comprises silicon oxynitride.

20. The method of claim 1, wherein said gate dielectric layer comprises high permittivity material selected from the group consisting of $La_2O_3$, $Al_2O_3$, $HfO_2$, $HfON$ and $ZrO_2$.

21. The method of claim 20, wherein a relative permittivity of said high permittivity material is greater than 5.

22. The method of claim 1, wherein said gate dielectric layer has thickness between 3 angstroms and 100 angstroms.

23. The method of claim 1, wherein said gate dielectric layer having a first thickness on said on said fin sidewall and a second thickness on said fin top, said first thickness being different than said second thickness.

24. The method of claim 23, wherein said second thickness being smaller than said first thickness.

25. The method of claim 23, wherein said second thickness is less than 20 angstroms.

26. The method of claim 1, wherein said gate material comprises poly-crystalline silicon.

27. The method of claim 1, wherein said gate material comprises poly-crystalline silicon germanium.

28. The method of claim 1, wherein said source and drain regions each having a lightly doped or extension region.

29. The method of claim 1, wherein an electrically conductive material deposited on the gate dielectric layer is formed an said source and drain regions.

30. The method of claim 29, wherein said electrically conductive material is selected from the group consisting of a metal, a metallic silicide and a metallic nitride.

31. A method for fabricating a multiple-gate device comprising the steps of:
- providing a substrate comprising semi-conducting layer overlaying an insulator stack said insulator stack comprises an insulator layer overlying an etch-stop layer;
- patterning said semi-conducting layer forming a semiconductor fin, said semiconductor fin having two sidewalls and a top;
- etching said insulator layer at the base of said semiconductor fin forming an undercut;
- depositing a gate dielectric layer overlying said semiconductor fin, said gate dielectric layer comprises a high permittivity material selected from the group consisting of $La_2O_3$, $Al_2O_3$, $HfO_2$, $HfON$ and $ZrO_2$;
- depositing an electrically conductive layer over said gate dielectric layer;
- etching said electrically conductive layer forming a gate straddling across said two sidewall surfaces and said top surface of the semiconductor fin; and
- forming a source region and a drain region in said semiconductor fin.

* * * * *